United States Patent
Chung et al.

(10) Patent No.: US 8,963,129 B2
(45) Date of Patent: Feb. 24, 2015

(54) ORGANIC LIGHT EMITTING DISPLAY DEVICE

(75) Inventors: Jin-Koo Chung, Yongin (KR); Jun-Ho Choi, Yongin (KR); Seong-Min Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 337 days.

(21) Appl. No.: 13/064,947

(22) Filed: Apr. 27, 2011

(65) Prior Publication Data
US 2011/0272675 A1  Nov. 10, 2011

(30) Foreign Application Priority Data
May 4, 2010  (KR) .................. 10-2010-0042068

(51) Int. Cl.
| | | |
|---|---|---|
| H01L 29/08 | (2006.01) |
| G09G 3/30 | (2006.01) |
| H01L 51/52 | (2006.01) |
| H01L 27/32 | (2006.01) |
| H01L 27/12 | (2006.01) |

(52) U.S. Cl.
CPC ........ H01L 51/5221 (2013.01); H01L 27/3246 (2013.01); H01L 27/326 (2013.01); *H01L 27/1225* (2013.01); *H01L 27/3202* (2013.01); *H01L 27/3211* (2013.01); *H01L 51/5215* (2013.01)
USPC .................. 257/40; 257/E51.018; 345/76

(58) Field of Classification Search
USPC ............... 257/40, 88, 98, E51.018, E51.021; 313/512, 498; 345/81, 76
See application file for complete search history.

(56) References Cited

U.S. PATENT DOCUMENTS

| | | | | |
|---|---|---|---|---|
| 8,274,090 B2* | 9/2012 | Choi et al. | ...... | 257/88 |
| 8,598,582 B2* | 12/2013 | Choi et al. | ...... | 257/59 |
| 2009/0066236 A1* | 3/2009 | Sung et al. | ...... | 313/504 |
| 2010/0102301 A1* | 4/2010 | Yang et al. | ...... | 257/40 |
| 2012/0280215 A1* | 11/2012 | Choi et al. | ...... | 257/40 |

FOREIGN PATENT DOCUMENTS

| | | |
|---|---|---|
| JP | 10-039757 | 2/1998 |
| JP | 2005-345946 | 12/2005 |
| JP | 2006-019142 | 1/2006 |
| JP | 2008-112112 | 5/2008 |
| KR | 10-2005-0072310 A | 7/2005 |

* cited by examiner

*Primary Examiner* — Jose R Diaz
(74) *Attorney, Agent, or Firm* — Lee & Morse, P.C.

(57) ABSTRACT

A transparent organic light emitting display device having a uniform transmittance of external light and having uniformly formed transmissive windows in pixels. The device includes a substrate; pixels formed on the substrate, each of the pixels comprising: at least one light emitting region for emitting light; at least one transmissive region for transmitting external light; and at least one circuit region comprising a pixel circuit unit; an insulating layer covering the pixel circuit unit; pixel electrodes formed on the insulating layer in the light emitting region and the transmissive region of each pixel, and electrically connected to the pixel circuit unit; an organic layer formed on the pixel electrodes; and a facing electrode formed on the organic layer, integrally formed over all of the pixels, and having transmissive windows, wherein each of the transmissive windows corresponds to the transmissive region of each of the pixels.

29 Claims, 7 Drawing Sheets

ORGANIC LIGHT EMITTING DISPLAY DEVICE

CROSS-REFERENCE TO RELATED APPLICATIONS

This application claims the benefit of Korean Patent Application No. 10-2010-0042068, filed on May 4, 2010, in the Korean Intellectual Property Office, the disclosure of which is incorporated herein in its entirety by reference.

BACKGROUND

1. Field

Aspects of the present invention relate to an organic light emitting display device, and more particularly, to a transparent organic light emitting display device.

2. Description of the Related Art

Organic light emitting display devices generally have wide viewing angles, high contrast ratios, short response times, and reduced power consumption, and thus are used across a variety of applications such as personal portable devices, such as MP3 players and mobile phones, or large screen displays, such as television sets, or other electronic devices displaying images. Also, an organic light emitting display device can be manufactured as a transparent display device by including transparent thin film transistors (TFTs) and transparent organic light emitting elements. However, in many organic light emitting display devices, a cathode is formed of metal and thus restricts improvements in the transmittance of the organic light emitting display device.

SUMMARY

Aspects of the present invention provide a transparent organic light emitting display device having a uniform transmittance of external light.

Aspects of the present invention also provide an organic light emitting display device having uniformly formed transmissive windows in pixels.

According to aspects of the present invention, there is provided an organic light emitting display device including a substrate; pixels formed on the substrate, each of the pixels including at least one light emitting region for emitting light, at least one transmissive region transmitting external light, and at least one circuit region comprising a pixel circuit unit; an insulating layer covering the pixel circuit unit; pixel electrodes formed on the insulating layer on the light emitting region and the transmissive region of each pixel, and electrically connected to the pixel circuit unit; an organic layer formed on the pixel electrodes; and a facing electrode formed on the organic layer, integrally formed over all of the pixels, and having transmissive windows, wherein each of the transmissive windows corresponds to the transmissive region of each of the pixels.

According to another aspect of the present invention, the pixel electrodes may be transparent electrodes.

According to another aspect of the present invention, the pixel electrodes may be transflective electrodes.

According to another aspect of the present invention, the facing electrode may be a reflective electrode.

According to another aspect of the present invention, the facing electrode may include a first facing electrode formed as a reflective electrode; and a second facing electrode formed as a transflective electrode, and each of the transmissive windows may be formed in the first facing electrode.

According to another aspect of the present invention, the transmissive windows may be independently formed in the pixels.

According to another aspect of the present invention, the transmissive windows may be integrally formed over at least two neighboring pixels.

According to another aspect of the present invention, the light emitting region of each pixel may include a first light emitting region, and a second light emitting region, wherein a respective transmissive region may be formed between the first light emitting region and the second light emitting region.

According to another aspect of the present invention, each of the pixel electrodes may include a first pixel electrode formed on the first light emitting region; and a second pixel electrode formed on the second light emitting region, wherein the first and second pixel electrodes may be connected to the pixel circuit unit in parallel.

According to another aspect of the present invention, the transmissive region may include a first transmissive region, and a second transmissive region, wherein the light emitting region may be formed between the first transmissive region and the second transmissive region.

According to aspects of the present invention, there is provided an organic light emitting display device including a substrate; pixels formed on the substrate, each of the pixels having at least one light emitting region for emitting light, at least one transmissive region for transmitting external light, and at least one circuit region comprising at least one thin film transistor (TFT); pixel electrodes formed on the light emitting region and the transmissive region of each pixel, and electrically connected to the TFT; an organic layer formed on the plurality of pixel electrodes; and a facing electrode formed on the organic layer, integrally formed over all of the pixels, and having transmissive windows, wherein each of the transmissive windows corresponds to the transmissive region of each of the pixels.

According to another aspect of the present invention, the pixel electrodes may be transparent electrodes.

According to another aspect of the present invention, the pixel electrodes may be transflective electrodes.

According to another aspect of the present invention, the facing electrode may be a reflective electrode.

According to another aspect of the present invention, the facing electrode may include a first facing electrode formed as a reflective electrode; and a second facing electrode formed as a transflective electrode, and each of the transmissive windows may be formed in the first facing electrode.

According to another aspect of the present invention, the transmissive windows may be independently formed in the plurality of pixels.

According to another aspect of the present invention, the transmissive windows may be integrally formed over at least two neighboring pixels.

According to another aspect of the present invention, the light emitting region of each pixel may include a first light emitting region and a second light emitting region, wherein a respective transmissive region may be formed between the first light emitting region and the second light emitting region.

According to another aspect of the present invention, each of the pixel electrodes may include a first pixel electrode formed on the first light emitting region; and a second pixel electrode formed on the second light emitting region, wherein the first pixel electrode and the second pixel electrode may be connected to the pixel circuit unit in parallel.

According to another aspect of the present invention, the transmissive region may include a first transmissive region, and a second transmissive region, wherein the light emitting region may be formed between the first transmissive region and the second transmissive region.

According to aspects of the present invention, a transparent display device having a uniform transmittance of light may be provided. Also, since a self-alignment function is performed to form transmissive windows in pixels, the transmissive windows may be uniformly sized. Furthermore, transmission of external light and dual emission may be realized together on a region where a transmissive window is formed.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
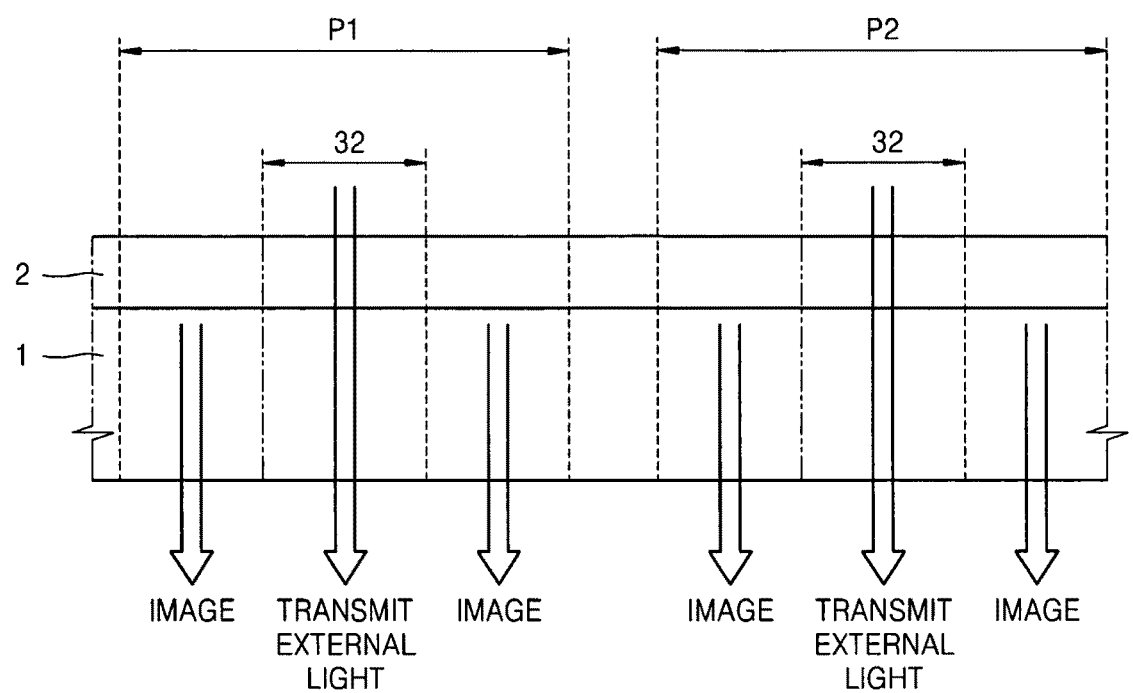
FIG. 1 is a cross-sectional view of an organic light emitting display device according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

It is to be understood that where is stated herein that one element, film or layer is "formed on" or "disposed on" a second element, layer or film, the first element, layer or film may be formed or disposed directly on the second element, layer or film or there may be intervening element, layers or films between the first element, layer or film and the second element, layer or film. Further, as used herein, the term "formed on" is used with the same meaning as "located on" or "disposed on" and is not meant to be limiting regarding any particular fabrication process.

FIG. 1 is a cross-sectional view of an organic light emitting display device according to an embodiment of the present invention. Referring to FIG. 1, the organic light emitting display device according to the present embodiment includes a substrate 1 and a display unit 2 formed on the substrate 1. External light incident on the organic light emitting display device is transmitted through the substrate 1 and the display unit 2.

As will be described later, the display unit 2 may transmit external light in such a way that a user located below the substrate 1 in FIG. 1 views an image displayed on the display unit 2 or views an external image formed by external light transmitted from above the substrate 1. The organic light emitting display device is illustrated as a bottom emission type in which the display unit 2 displays an image toward the substrate 1. However, aspects of the present invention are not limited thereto and the organic light emitting display device may also be applied to a top emission type in which the display unit 2 displays an image away from the substrate 1. In this case, a user located above the substrate 1 may view an image displayed on the display unit 2 or an external image formed by external light transmitted from below the substrate 1. Furthermore, the organic light emitting display device may also be applied to a dual emission type in which the display unit 2 displays an image toward the substrate 1 and away from the substrate 1.

FIG. 1 illustrates two neighboring pixels of the organic light emitting display device, which are a first pixel P1 and a second pixel P2. Each of the first and second pixels P1 and P2 includes a transmissive region 32 through which external light is transmitted, and a region having at least a portion displaying an image. That is, since each of the first and second pixels P1 and P2 transmits external light through respective ones of the transmissive region 32, which is a partial pixel region, when the display unit 2 does not display an image, the user may view an external image.

In this case, if elements such as a thin film transistor (TFT), a capacitor, and conductive lines are not formed on the transmissive region 32, the transmittance of external light through the transmissive region 32 may be maximized and thus the transmittance of external light of the whole display unit 2 may be increased. Also, distortion of a transmitted image due to interference by the elements may be reduced.

Figure 2:
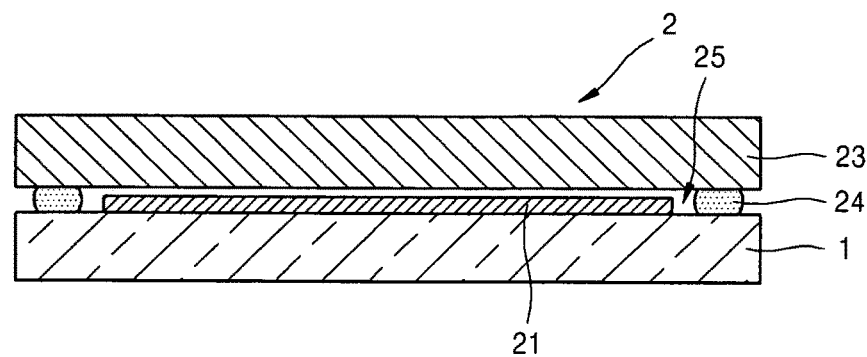
FIG. 2 is a detailed cross-sectional view of the organic light emitting display device illustrated in FIG. 1, according to an embodiment of the present invention.

FIG. 2 is a detailed cross-sectional view of the organic light emitting display device illustrated in FIG. 1, according to an embodiment of the present invention. Referring to FIG. 2, the display unit 2 includes an organic light emitting unit 21 formed on the substrate 1, and a sealing substrate 23 sealing the organic light emitting unit 21. The sealing substrate 23 is formed of a transparent material, and the organic light emitting unit 21 blocks permeation of ambient air and moisture. Edges of the substrate 1 and the sealing substrate 23 are bonded to each other by using a sealant 24 and thus a space 25 between the substrate 1 and the sealing substrate 23 is sealed. A desiccant or a filler is filled into the space 25.

Figure 3:
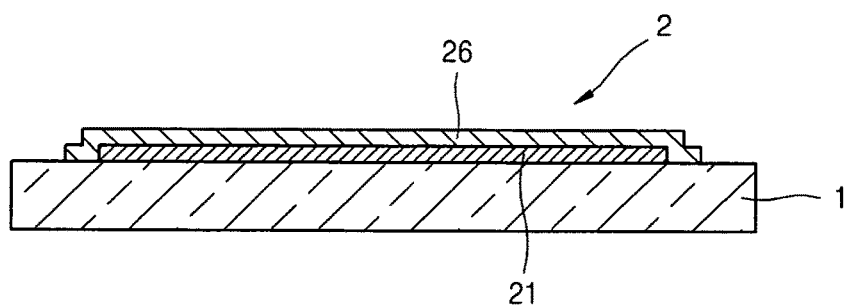
FIG. 3 is a detailed cross-sectional view of the organic light emitting display device illustrated in FIG. 1, according to another embodiment of the present invention.

According to aspects of the present invention, instead of using the sealing substrate 23, as illustrated in FIG. 3, a thin sealing film 26 is formed on the organic light emitting unit 21 and may protect the organic light emitting unit 21 from ambient air. The sealing film 26 has a structure in which a layer formed of an inorganic material such as silicon oxide or silicon nitride and a layer formed of an organic material such as epoxy or polyimide are alternately stacked. However aspects of the present invention are not limited thereto, and the structure of the sealing film 26 may be one of any sealing structure in the form of a transparent thin film.

Although not shown in FIG. 2 or 3, similar to the structure sealing the organic light emitting unit 21, the sealing substrate 23 illustrated in FIG. 2 may also be formed after the sealing film 26 illustrated in FIG. 3 is formed.

Figure 4:
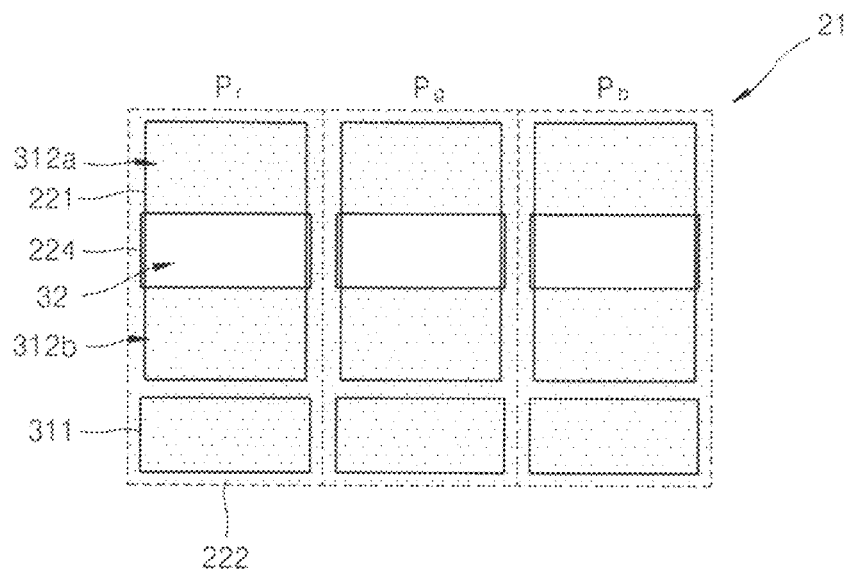
FIG. 4 is a plan view of neighboring red, green and blue pixels of an organic light emitting unit illustrated in FIG. 2 or 3, according to an embodiment of the present invention.

Examples of the organic light emitting unit 21 will now be described in detail with reference to FIG. 4. FIG. 4 is a plan view of neighboring red, green and blue pixels Pr, Pg and Pb of the organic light emitting unit 21 illustrated in FIG. 2 or 3, according to an embodiment of the present invention.

Referring to FIG. 4, each of the red, green and blue pixels Pr, Pg and Pb includes a first light emitting region 312a, a second light emitting region 312b, and a circuit region 311 adjacent to the second light emitting region 312b. Each transmissive region 32 is formed between respective ones of the first and second light emitting regions 312a and 312b. Thus, as illustrated in FIG. 4, the red, green and blue pixels Pr, Pg, and Pb each individually include the transmissive region 32.

Figure 5:
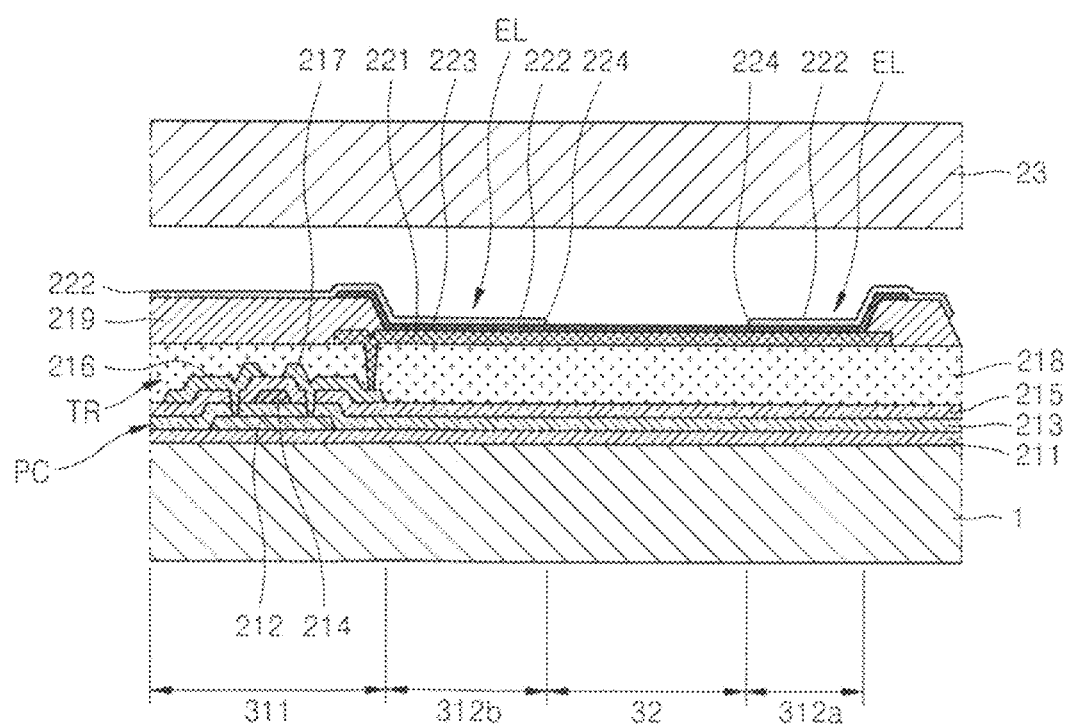
FIG. 5 is a cross-sectional view of one of the red, green and blue pixels illustrated in FIG. 4, according to an embodiment of the present invention.

FIG. 5 is a cross-sectional view of one of the red, green and blue pixels Pr, Pg, and Pb illustrated in FIG. 4. Referring to FIG. 5, a TFT TR is formed on the circuit region 311. However, aspects of the present invention are not limited to the TFT TR, and a pixel circuit unit PC including the TFT TR may also be formed as illustrated in FIG. 5. In addition to the TFT TR, the pixel circuit unit PC may further include a plurality of TFTs and a storage capacitor, and conductive lines connected to the TFTs and the storage capacitor, such as a scan line, a data line and a Vdd line.

An organic light emitting element EL is formed on the first and second light emitting regions 312a and 312b. The organic light emitting element EL is electrically connected to the TFT TR of the pixel circuit unit PC. A buffer layer 211 is formed on the substrate 1, and then the pixel circuit unit PC including the TFT TR is formed on the buffer layer 211. A semiconductor active layer 212 is formed on the buffer layer 211.

The buffer layer 211 is formed of any one of various transparent insulators preventing permeation of impure elements and to planarize a surface of the substrate 1. For example, the buffer layer 211 is formed of an inorganic material such as silicon oxide, silicon nitride, silicon oxynitride, aluminum oxide, aluminum nitride, titanium oxide or titanium nitride, or an organic material such as polyimide, polyester or acryl, or may be formed of a stacked structure thereof. However, aspects of the present invention are not limited thereto and the buffer layer 211 in not an essential element, and thus may not be formed in some cases.

The semiconductor active layer 212 is formed of polycrystalline silicon, but is not limited thereto and may also be formed of an oxide semiconductor such as G-I-Z-O [a($In_2O_3$) b($Ga_2O_3$)c(ZnO)], wherein a, b and c are real numbers satisfying a≥0, b≥0 and c>0. However, when the semiconductor active layer 212 is formed of an oxide semiconductor, external light may be transmitted through the circuit region 311 and thus the transmittance of external light of the whole display unit 2 may be increased.

A gate insulating layer 213 is formed on the buffer layer 211 by using a transparent insulator so as to cover the semiconductor active layer 212, and a gate electrode 214 is formed on the gate insulating layer 213. An interlayer insulating layer 215 is formed on the gate insulating layer 213 by using a transparent insulator so as to cover the gate electrode 214, and a source electrode 216 and drain electrode 217 are formed on the interlayer insulating layer 215 so as to contact the semiconductor active layer 212 through contact holes. Thus, the TFT TR is formed. However, aspects of the present invention are not limited to a structure described above and the TFT TR may have any of various TFT structures.

A first insulating layer 218 is formed to cover the pixel circuit unit PC including the TFT TR. The first insulating layer 218 is at least one of a monolayer or multilayer insulating layer, of which an upper surface is planarized. The first insulating layer 218 is formed of at least one of a transparent inorganic insulator and an organic insulator (a transparent inorganic insulator and/or an organic insulator). The first insulating layer 218 is integrally formed over all pixels.

As illustrated in FIG. 5, a pixel electrode 221 of the organic light emitting element EL is electrically connected to the TFT TR and is formed on the first insulating layer 218. The pixel electrode 221 is a separate and independent island for each of the pixels Pr, Pg and Pb. According to an embodiment of the present invention, as illustrated in FIGS. 4 and 5, the pixel electrode 221 extends over the first and second light emitting regions 312a and 312b, and the transmissive region 32.

A second insulating layer 219 is formed on the first insulating layer 218, and is at least one of an organic and inorganic insulator. The second insulating layer 219 covers at least edges of and exposes a center portion of the pixel electrode 221. The second insulating layer 219 covers a portion of each pixel corresponding to at least the circuit region 311 of each pixel, and is integrally formed over the whole organic light emitting unit 21 of the substrate 1. However aspects of the present invention are not limited thereto, and the second insulating layer 219 does not necessarily cover the whole circuit region 311, and may cover only a portion of the circuit region 311. More particularly, the second insulating layer 219 may cover a portion of the circuit region 311 corresponding to the edges of the pixel electrode 221.

Although the second insulating layer 219 is illustrated as a single layer in FIG. 5, aspects of the present invention are not limited thereto and the second insulating layer 219 may also be formed as a plurality of layers. Furthermore, the second insulating layer 219 may not necessarily have a uniform thickness as illustrated in FIG. 5, and a spacer supporting the sealing substrate 23 may protrude from an upper surface of the second insulating layer 219 by using the same material used to form the second insulating layer 219. An organic layer 223 and a facing electrode 222 are sequentially stacked on the pixel electrode 221. The facing electrode 222 is integrally formed over all the pixels Pr, Pg, and Pb and covers the organic layer 223 and the second insulating layer 219.

The organic layer 223 is formed as a low or high molecular organic layer. If a low molecular organic layer is used, a hole injection layer (HIL), a hole transport layer (HTL), an emission layer (EML), an electron transport layer (ETL), an electron injection layer (EIL) and the like are stacked in a monolayer or multilayer structure. Any of various low molecular organic materials such as copper phthalocyanine (CuPc), N,N'-di(naphthalene-1-yl)-N,N'-diphenyl-benzidine (NPB) and tris-8-hydroxyquinoline aluminum (Alq3) is used. The low molecular organic layer is formed through a vacuum deposition method. In this case, the HIL, the HTL, the ETL and the EIL are common layers and are commonly used in the red, green and blue pixels Pr, Pg, and Pb. The pixel electrode 221 functions as an anode and the facing electrode 222 functions as a cathode. However, aspects of the present invention are not limited thereto, and the polarities of the pixel electrode 221 and the facing electrode 222 may be exchanged with each other.

In FIGS. 4 and 5, the pixel electrode 221 is a transparent electrode and the facing electrode 222 is a reflective electrode. The pixel electrode 221 is formed of a material having a high work function, such as indium tin oxide (ITO), indium zinc oxide (IZO), zinc oxide (ZnO) or $In_2O_3$. The facing electrode 222 is formed of metal having a low work function, such as silver (Ag), magnesium (Mg), aluminum (Al), platinum (Pt), palladium (Pd), gold (Au), nickel (Ni), neodymium (Nd), iridium (Ir), chromium (Cr), lithium (Li) or calcium (Ca). However aspects of the present invention are not limited thereto and the pixel electrode 221 and the facing electrode 222 may be formed of other suitable materials. Accordingly, a bottom emission structure, in which the organic light emitting element EL displays an image toward the pixel electrode 221, is realized.

However, aspects of the present invention are not limited thereto, and the pixel electrode 221 may be a transflective electrode in order to improve efficiency and color reproduction of the display unit 2. Here, the transflective electrode partially transmits and partially reflects light emitted from the organic layer 223. As such, optical resonance occurs between the pixel electrode 221 and the facing electrode 222, and thus a light emission efficiency of the display unit 2 may be maximized. With the transflective electrode, a stacked structure having a transparent conductive layer and a reflective layer, which is a triple layer sequentially stacking a transparent conductive layer, a reflective layer, and a transparent conductive layer, may be used. For example, the transparent conductive layer may be formed of ITO, IZO, ZnO or $In_2O_3$, and the reflective layer may be formed of Ag, Mg, Al, Pt, Pd, Au, Ni, Nd, Ir, Cr, Li or Ca. Particularly, a stacked structure of ITO/Ag/ITO may be used and, in this case, Ag may be formed to a thickness of about 50 Å to about 250 Å.

The sealing substrate 23 is formed on the facing electrode 222. As illustrated in FIG. 2, the sealing substrate 23 is bonded to the substrate 1 using the sealant 24 around the display unit 2 and seals the display unit 2 from ambient air. A filler (not shown) and a moisture absorbent (not shown) are filled in the space 25 between the sealing substrate 23 and the facing electrode 222. However, aspects of the present invention are not limited thereto and the structure for sealing the display unit 2 and instead of the sealing substrate 23 as illustrated in FIG. 5, the sealing film 26 may also be used as illustrated in FIG. 3.

A transmissive window 224 is formed in the facing electrode 222 at a location corresponding to the transmissive region 32. The transmissive window 224 is formed by removing a portion of the facing electrode 222 or by not depositing the facing electrode 222 on a portion corresponding to the transmissive window 224. Thus a hole is formed in the facing electrode 222. Accordingly, external light may be transmitted through the transmissive window 224 and may be provided to a user.

In the present embodiment, the organic layer 223, the pixel electrode 221, the first insulating layer 218, the interlayer insulating layer 215, the gate insulating layer 213 and the buffer layer 211 are also formed so as to transmit external light through the transmissive region 32 where the transmissive window 224 is formed. However, the above-mentioned layers have high light transmittances and thus a user located below the substrate 1 may sufficiently view an external image formed on the sealing substrate 23 through the transmissive window 224. Also, conductive patterns such as conductive lines are not formed on the transmissive region 32 where the transmissive window 224 is formed, and thus a problem such as distortion of the external image caused by diffraction of external light due to the conductive patterns may be prevented.

The transmissive window 224 is formed in the facing electrode 222 to increase the transmittance of external light through the transmissive region 32. Thus, the transmissive window 224 formed in each of the red, green and blue pixels Pr, Pg, and Pb is uniformly sized as illustrated in FIG. 4. The uniform sizing of the transmissive window 224 is achieved by disposing the transmissive window 224 between the first and second light emitting regions 312a and 312b.

If the transmissive window 224 is formed by defining a region of the transmissive region 32 while not forming the pixel electrode 221 on the transmissive region 32, accurate alignment is required between the substrate 1 and a mask forming the transmissive window 224. If a misalignment occurs, the transmissive region 32 may partially overlap the first and second light emitting regions 312a and 312b. Thus, the size of the transmissive window 224 and the size of the first and second light emitting regions 312a and 312b may be reduced. As such, all pixels of the display unit 2 may be formed in non-uniform sizes and a serious problem may occur.

As illustrated in FIG. 5, the transmissive region 32 is defined by a region where the facing electrode 222 is not formed on the pixel electrode 221. In more detail, when the facing electrode 222 is deposited by using opaque metal, a self-alignment function defined by the first and second light emitting regions 312a and 312b is performed. Although a misalignment may occur to cause a change in the location of the transmissive region 32, the size of the transmissive region 32 may be hardly changed. This is because the organic light emitting element EL emits light at only a location where the pixel electrode 221 functioning as an anode and the facing electrode 222 functioning as a cathode face each other. Since the pixel electrode 221 is also formed on the transmissive region 32, the transmissive region 32 is formed according to whether the facing electrode 222 is deposited. That is, a region where the facing electrode 222 is deposited corresponds to the first and second light emitting regions 312a and 312b, and a region where the facing electrode 222 is not deposited corresponds to the transmissive region 32.

Figure 6:
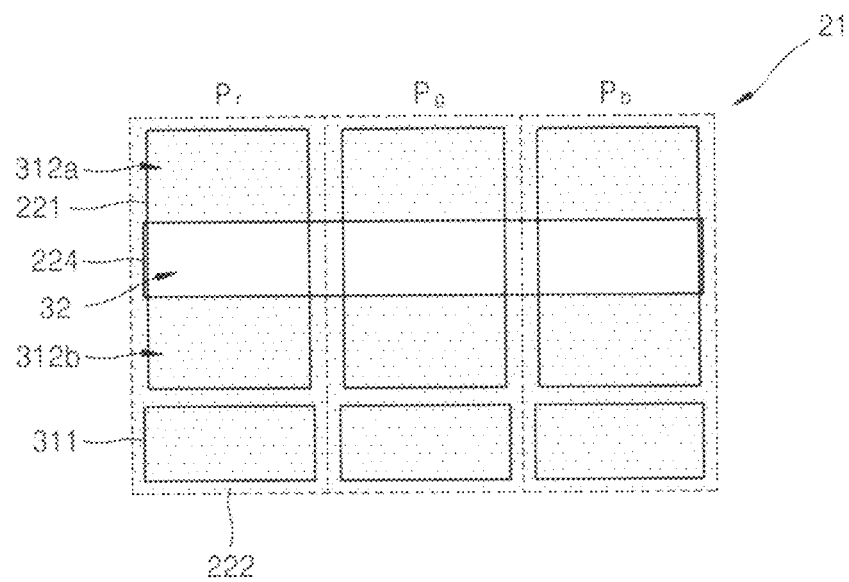
FIG. 6 is a plan view of neighboring red, green and blue pixels of an organic light emitting unit illustrated in FIG. 2 or 3, according to another embodiment of the present invention.

FIG. 6 is a plan view of neighboring red, green and blue pixels Pr, Pg and Pb of the organic light emitting unit 21 illustrated in FIGS. 2 and 3, according to another embodiment of the present invention. Referring to FIG. 6, the transmissive window 224 is integrally formed over the red, green and blue pixels Pr, Pg, and Pb. In FIG. 6, the area of the transmissive region 32 through which external light may be transmitted is increased and thus the transmittance of the whole display unit 2 may increase.

The transmissive window 224 is integrally formed over all of the red, green and blue pixels Pr, Pg, and Pb in FIG. 6. However, aspects of the present invention are not limited thereto and the transmissive window 224 may be integrally formed over only two neighboring pixels from among the red, green and blue pixels Pr, Pg and Pb. Also, if a TFT signal line exists between neighboring pixels from among the red, green and blue pixels Pr, Pg and Pb, although one transmissive window 224 is formed in the facing electrode 222, a plurality of transmissive windows 224 may be realized.

Figure 7:
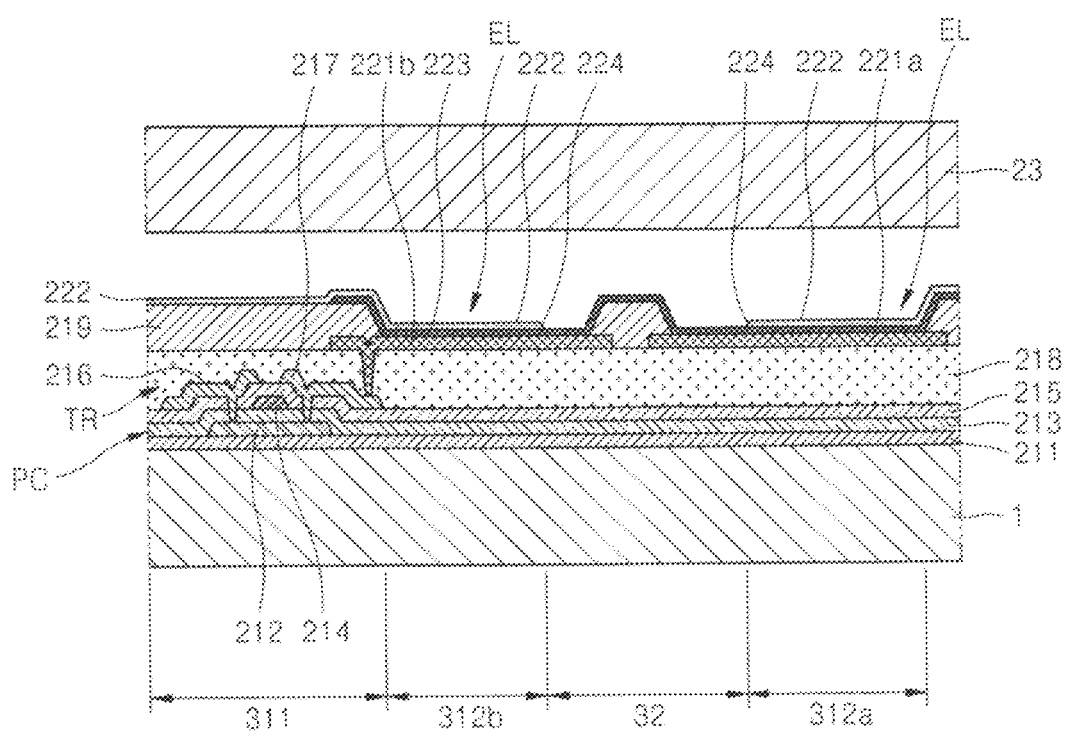
FIG. 7 is a cross-sectional view of one of the red, green and blue pixels illustrated in FIG. 6, according to an embodiment of the present invention.

FIG. 7 is a cross-sectional view of one of the red, green and blue pixels Pr, Pg, and Pb illustrated in FIG. 6, according to an embodiment of the present invention. Referring to FIG. 7, a first pixel electrode 221a on a first light emitting region 312a and a second pixel electrode 221b on the second light emitting region 312b are separately formed. Although not clearly shown in FIG. 7, the first and second pixel electrodes 221a and 221b are connected to the TFT TR of the pixel circuit unit PC in parallel.

In this structure, if an error such as a dark spot occurs in the first and second pixel electrodes 221a and 221b due to, for example, a particle, an error of a pixel may be prevented by interrupting only one of the first and second pixel electrodes 221a and 221b. Thus a yield rate in manufacturing the TFT TR may be increased. In this case, the second insulating layer 219 covers edges of the first and second pixel electrodes 221a and 221b, which face each other, and thus a short may be prevented between the edges of the first and second pixel electrodes 221a and 221b.

Figure 8:
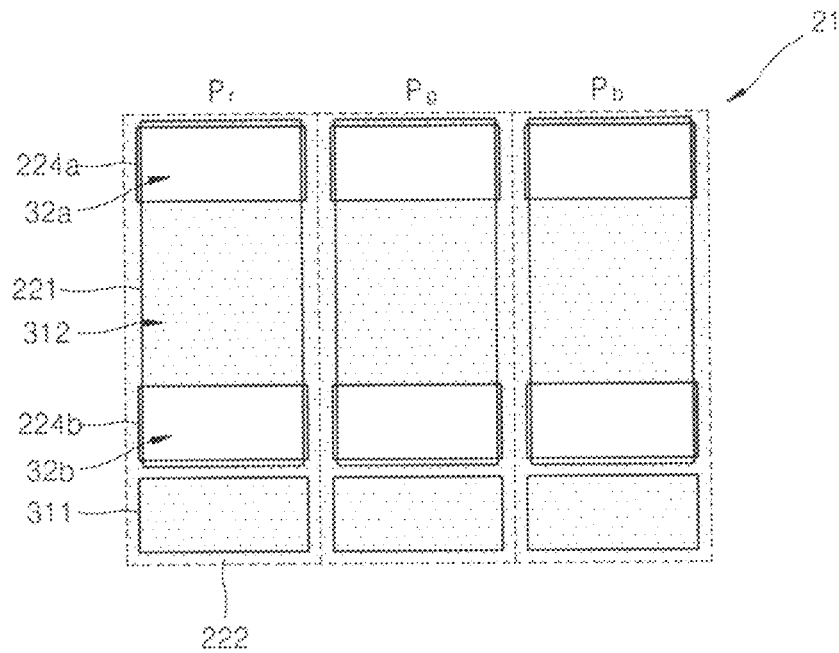
FIG. 8 is a plan view of neighboring red, green and blue pixels of an organic light emitting unit illustrated in FIG. 2 or 3, according to another embodiment of the present invention.
Figure 9:
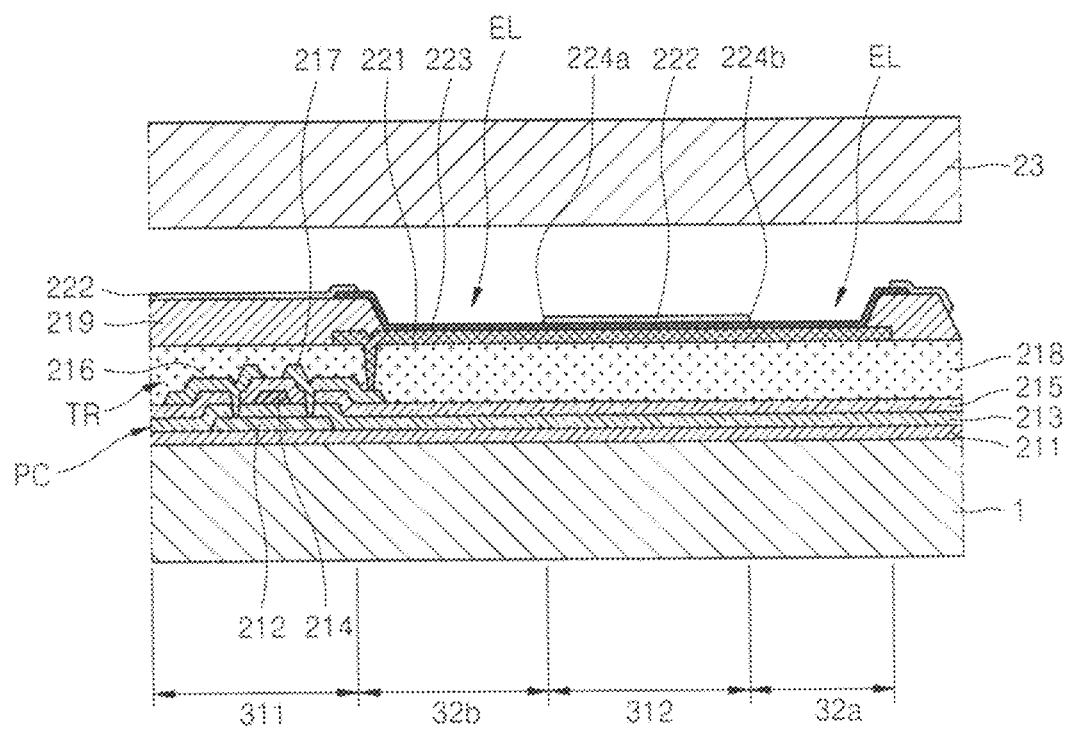
FIG. 9 is a cross-sectional view of one of the red, green and blue pixels illustrated in FIG. 8, according to an embodiment of the present invention.

FIG. 8 is a plan view of neighboring red, green and blue pixels Pr, Pg and Pb of the organic light emitting unit 21 illustrated in FIGS. 2 and 3, according to another embodiment of the present invention. FIG. 9 is a cross-sectional view of one of the red, green and blue pixels Pr, Pg and Pb illustrated in FIG. 8, according to an embodiment of the present invention. Referring to FIGS. 8 and 9, a first transmissive region 32a and a second transmissive region 32b are separately formed, and a light emitting region 312 is formed between the first and second transmissive regions 32a and 32b. A first transmissive window 224a is formed on the first transmissive region 32a and a second transmissive window 224b is formed on the second transmissive region 32b.

In this case, in a region where the pixel electrode 221 is formed, only a region where the facing electrode 222 is deposited emits light. Regions where the facing electrode 222 is not deposited are defined as the first and second transmissive regions 32a and 32b, and thus the self-alignment function described above in relation to FIGS. 4 and 5 is performed in order to define the first and second transmissive regions 32a and 32b.

Figure 10:
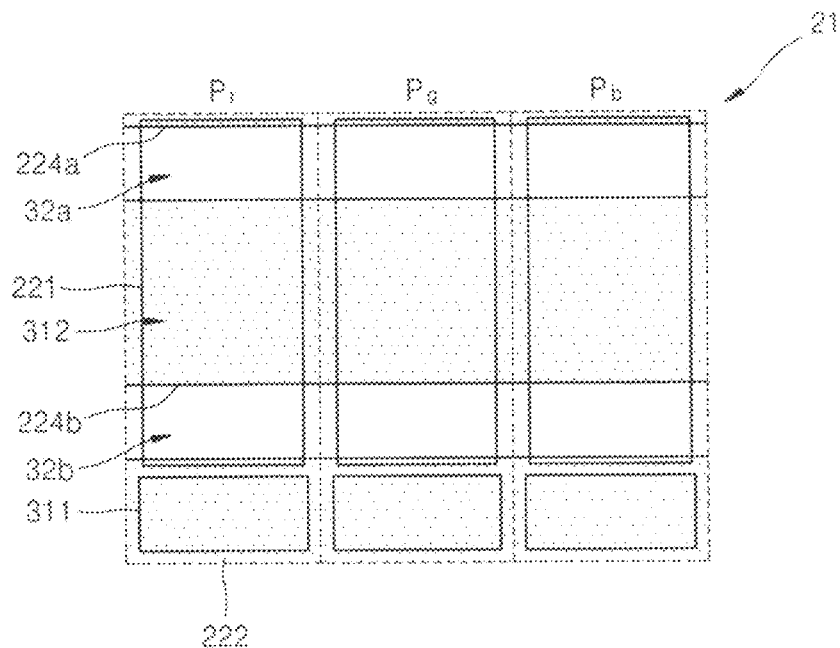
FIG. 10 is a plan view of neighboring red, green and blue pixels of an organic light emitting unit illustrated in FIG. 2 or 3, according to another embodiment of the present invention.

In FIG. 8, each of the first and second transmissive windows 224a and 224b is integrally formed over the red, green and blue pixels Pr, Pg, and Pb as illustrated in FIG. 10. This structure is formed by linearly depositing the facing electrode 222 to cross in a middle of a region where the pixel electrode 221 is formed. Although not shown in FIG. 8, the facing electrode 222 may be integrally formed over all pixels. A region where the facing electrode 222 is formed is defined as the light emitting region 312, and the first and second transmissive windows 224a and 224b are formed on regions around the light emitting region 312. As such, each of the first and second transmissive windows 224a and 224b may be integrally formed over the red, green and blue pixels Pr, Pg, and Pb.

Figure 11:
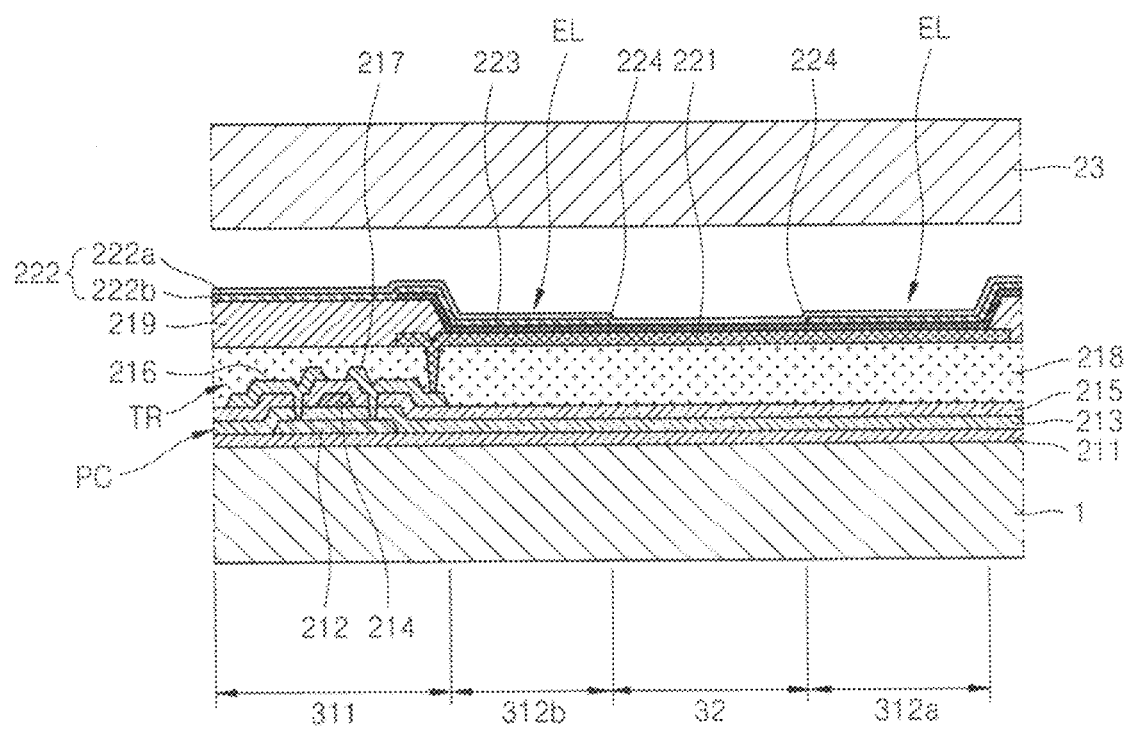
FIG. 11 is a cross-sectional view of one of the red, green and blue pixels illustrated in FIG. 4, according to another embodiment of the present invention.

FIG. 11 is a cross-sectional view of one of the red, green and blue pixels Pr, Pg, and Pb illustrated in FIG. 4, according to another embodiment of the present invention.

Referring to FIG. 11, the facing electrode 222 includes a first facing electrode 222a and a second facing electrode 222b stacked on the first facing electrode 222a. The first facing electrode 222a is formed as an opaque electrode, such as a reflective electrode. The second facing electrode 222b may be formed as a transflective electrode. For example, the reflective electrode is formed of Ag, Mg, Al, Pt, Pd, Au, Ni, Nd, Ir, Cr, Li or Ca, and the transflective electrode may include a thin transflective layer formed of Mg, Ag and/or Al and may further include a transparent oxide such as ITO, IZO, ZnO or $In_2O_3$. However, aspects of the present invention are not limited thereto, and the reflective electrode and the transflective electrode may be formed of other suitable materials. In present case, the transmissive window 224 is formed in the first facing electrode 222a. Except for the first and second facing electrodes 222a and 222b, the structure illustrated in FIG. 11 is the same as the structure illustrated in FIG. 5.

This structure, which is a bottom emission structure in which an image is displayed toward the substrate 1, is realized on the first and second light emitting regions 312a and 312b. Also, a dual emission structure, in which an image is displayed toward the substrate 1 and toward the sealing substrate 23, is realized on the transmissive region 32 where the transmissive window 224 is formed.

When an image is not displayed, since only the second facing electrode 222b is formed on the transmissive region 32, external light transmits through the transmissive region 32 so that an external image is viewable. Accordingly, the transmissive region 32, where the transmissive window 224 is formed, transmits external light and thus, the dual emission structure is realized.

Figure 12:
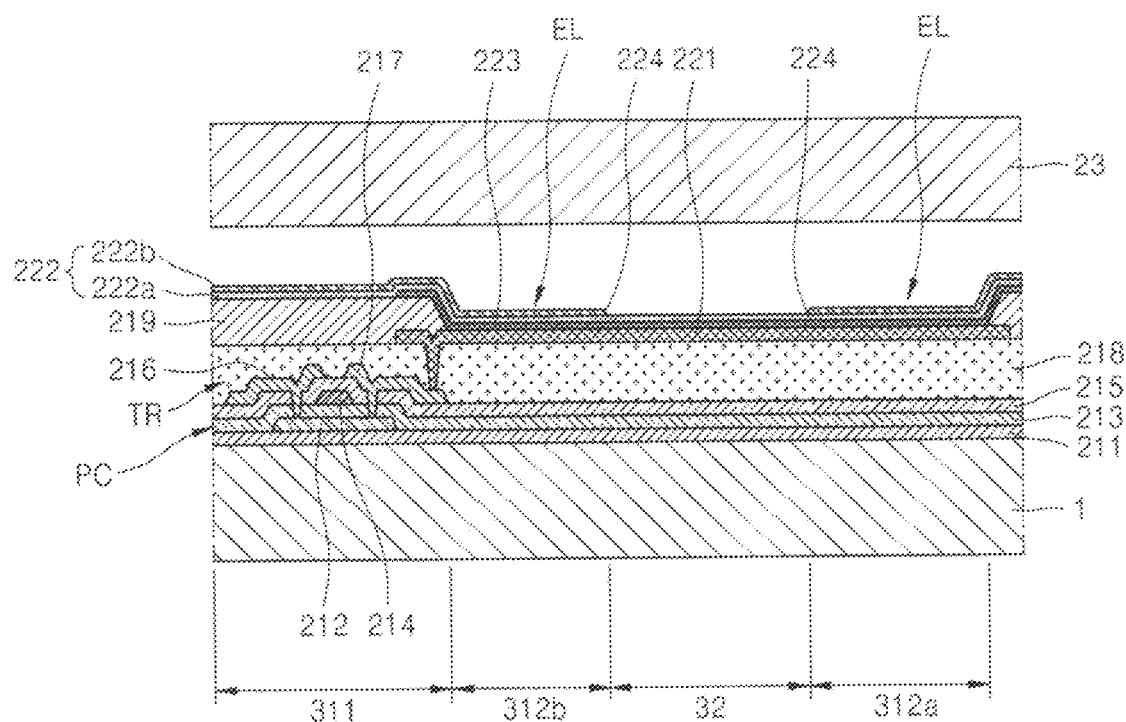
FIG. 12 is a cross-sectional view of one of the red, green and blue pixels illustrated in FIG. 4, according to another embodiment of the present invention.

However, aspects of the present invention are not limited to the structure illustrated in FIG. 11 and the structure may be changed as illustrated in FIG. 12. Referring to FIG. 12, the second facing electrode 222b is a transflective electrode and is formed first. Then the first facing electrode 222a, which is a reflective electrode, is stacked on the second facing electrode 222b. In this case, the transmissive window 224 is also formed in the first facing electrode 222a. The structures transmitting external light and realizing dual emission, which are illustrated in FIGS. 11 and 12, may also be applied to the structures illustrated in FIGS. 6 through 10.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display device, comprising:
   a substrate;
   pixels formed on the substrate, each of the pixels comprising:
      at least one light emitting region emitting light;
      at least one transmissive region transmitting external light; and
      at least one circuit region comprising a pixel circuit unit;
   an insulating layer covering the pixel circuit unit;
   pixel electrodes formed on the insulating layer on the light emitting region and the transmissive region of each pixel, and electrically connected to the pixel circuit unit;
   an organic layer formed on the pixel electrodes; and
   a facing electrode formed on the organic layer, integrally formed over all of the pixels, and having transmissive windows,
   wherein each of the transmissive windows is aligned with a corresponding transmissive region such that external light incident on one side of the organic light emitting display device is transmitted through the organic light emitting display device by way of the transmissive region of each of the pixels and the transmissive windows to be viewable on an opposite side of the organic light emitting display device.

2. The device as claimed in claim 1, wherein the pixel electrodes are transparent electrodes.

3. The device as claimed in claim 1, wherein the pixel electrodes are transflective electrodes.

4. The device as claimed in claim 1, wherein the facing electrode is a reflective electrode.

5. The device as claimed in claim 1, wherein the facing electrode includes:

a first facing electrode formed as a reflective electrode; and
a second facing electrode formed as a transflective electrode, and
wherein each of the transmissive windows is formed in the first facing electrode.

6. The device as claimed in claim 1, wherein the transmissive windows are independently formed in the pixels.

7. The device as claimed in claim 1, wherein the transmissive windows are integrally formed over at least two neighboring pixels.

8. The device as claimed in claim 1, wherein the light emitting region of each pixel:
a first light emitting region; and
a second light emitting region,
wherein a respective transmissive region is formed between the first light emitting region and the second light emitting region.

9. The device as claimed in claim 8, wherein each of the pixel electrodes includes:
a first pixel electrode formed on the first light emitting region; and
a second pixel electrode formed on the second light emitting region,
wherein the first and second pixel electrodes are connected to the pixel circuit unit in parallel.

10. The device as claimed in claim 1, wherein the transmissive region includes:
a first transmissive region; and
a second transmissive region,
wherein the light emitting region is formed between the first transmissive region and the second transmissive region.

11. An organic light emitting display device, comprising:
a substrate;
pixels formed on the substrate, each of the pixels comprising:
at least one light emitting region for emitting light;
at least one transmissive region for transmitting external light; and
at least one circuit region comprising at least one thin film transistor (TFT);
pixel electrodes formed on the light emitting region and the transmissive region of each pixel, and electrically connected to the TFT;
an organic layer formed on the plurality of pixel electrodes; and
a facing electrode formed on the organic layer, integrally formed over all of the pixels, and having transmissive windows,
wherein each of the transmissive windows is aligned with a corresponding transmissive region such that external light incident on the organic light emitting display device is transmitted through the organic light emitting display device by way of the transmissive region of each of the pixels and the transmissive windows to be viewable on an opposite side of the organic light emitting display device.

12. The device as claimed in claim 11, wherein the pixel electrodes are transparent electrodes.

13. The device as claimed in claim 11, wherein the pixel electrodes are transflective electrodes.

14. The device as claimed in claim 11, wherein the facing electrode is a reflective electrode.

15. The device as claimed in claim 11, wherein the facing electrode includes:
a first facing electrode formed as a reflective electrode; and
a second facing electrode formed as a transflective electrode,
wherein each of the transmissive windows is formed in the first facing electrode.

16. The device as claimed in claim 11, wherein the transmissive windows are independently formed in the plurality of pixels.

17. The device as claimed in claim 11, wherein the transmissive windows are integrally formed over at least two neighboring pixels.

18. The device as claimed in claim 11, wherein the light emitting region of each pixel includes:
a first light emitting region; and
a second light emitting region,
wherein a respective transmissive region is formed between the first light emitting region and the second light emitting region.

19. The device as claimed in claim 18, wherein each of the pixel electrodes includes:
a first pixel electrode formed on the first light emitting region; and
a second pixel electrode formed on the second light emitting region,
wherein the first pixel electrode and the second pixel electrode are connected to the pixel circuit unit in parallel.

20. The device as claimed in claim 11, wherein the transmissive region includes:
a first transmissive region; and
a second transmissive region,
wherein the light emitting region is formed between the first transmissive region and the second transmissive region.

21. An organic light emitting display device having a substrate, a pixel circuit area having a pixel circuits disposed on the substrate, and a light emitting area having pixels, each of the pixels including:
a first light emitting region;
a second light emitting region; and
a transmissive region disposed between the first light emitting region and the second light emitting region, the transmissive region transmitting external light that is incident at one side of the organic light emitting display such that the external light passes through the organic light emitting display by way of the transmissive region to be viewable on an opposite side of the organic light emitting display device.

22. The organic light emitting display device as claimed in claim 21, wherein each of the pixels includes:
a pixel electrode connected to a respective one of the pixel circuits;
an organic layer disposed on the pixel electrode; and
a facing electrode disposed on the organic layer and having a transmissive window, the transmissive window aligned with the transmissive region such that the external light passing through the organic light emitting display by way of the transmissive region also passes through the transmissive window.

23. The organic light emitting display device as claimed in claim 22, wherein the transmissive window includes:
a first transmissive window formed on the first light emitting region; and
a second transmissive window formed on the second light emitting region,
wherein a portion of the facing electrode is disposed over the transmissive region.

24. The device as claimed in claim 22, wherein the pixel electrode is a transparent electrode.

25. The device as claimed in claim 22, wherein the pixel electrode is a transflective electrode.

26. The device as claimed in claim 22, wherein the facing electrode is a reflective electrode.

27. The device as claimed in claim 22, wherein the facing electrode includes:
   a first facing electrode formed as a reflective electrode; and
   a second facing electrode formed as a transflective electrode, and
   wherein the transmissive window is formed in the first facing electrode.

28. The device as claimed in claim 22, wherein the transmissive window is independently formed in each of the pixels.

29. The device as claimed in claim 22, wherein the transmissive window is integrally formed over at least two neighboring pixels.

* * * * *